(12) United States Patent
Van Der Net

(10) Patent No.: US 8,885,142 B2
(45) Date of Patent: *Nov. 11, 2014

(54) LITHOGRAPHIC APPARATUS AND DEVICE MANUFACTURING METHOD

(75) Inventor: Antonius Johannus Van Der Net, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 917 days.

This patent is subject to a terminal disclaimer.

(21) Appl. No.: 13/044,358

(22) Filed: Mar. 9, 2011

(65) Prior Publication Data

US 2011/0157568 A1 Jun. 30, 2011

Related U.S. Application Data

(63) Continuation of application No. 11/889,844, filed on Aug. 16, 2007, now Pat. No. 7,924,404.

(51) Int. Cl.
*G03F 7/20* (2006.01)

(52) U.S. Cl.
CPC ........ *G03F 7/70341* (2013.01); *G03F 7/70858* (2013.01)
USPC .................... 355/53; 355/30; 355/77; 96/174

(58) Field of Classification Search
CPC ............ G03F 7/70341; G03F 7/70858; F17C 2205/0146; F17C 2205/0138; F17C 2205/0142
USPC ........ 355/53, 77; 137/154, 170.1, 170.2, 197, 137/201, 206–214, 253, 263, 266; 95/241; 96/155, 156, 174

See application file for complete search history.

(56) References Cited

U.S. PATENT DOCUMENTS

| | | | |
|---|---|---|---|
| 4,509,852 A | 4/1985 | Tabarelli et al. | |
| 7,227,615 B2 | 6/2007 | Tokita | |
| 7,924,404 B2* | 4/2011 | Van Der Net | 355/53 |
| 2004/0136494 A1 | 7/2004 | Lof et al. | |
| 2004/0207824 A1 | 10/2004 | Lof et al. | |
| 2005/0094125 A1 | 5/2005 | Arai | |
| 2005/0282405 A1 | 12/2005 | Harpham et al. | |
| 2006/0038968 A1 | 2/2006 | Kemper et al. | |
| 2006/0082746 A1 | 4/2006 | Mertens et al. | |
| 2006/0176456 A1 | 8/2006 | Nagasaka et al. | |

FOREIGN PATENT DOCUMENTS

| | | |
|---|---|---|
| EP | 1420298 A2 | 5/2004 |
| EP | 1420300 A2 | 5/2004 |
| EP | 1420300 A3 | 8/2005 |
| EP | 1420298 A3 | 10/2005 |
| WO | 99/49504 | 9/1999 |

* cited by examiner

*Primary Examiner* — Steven H Whitesell Gordon
(74) *Attorney, Agent, or Firm* — Pillsbury Winthrop Shaw Pittman LLP

(57) ABSTRACT

A manifold is provided between an outlet of a fluid supply system for an immersion lithographic apparatus and a separator. The manifold is provided with a pressure sensor which passes the measured pressure in the manifold to a mass flow controller. The mass flow controller controls a leak flow into the manifold based on the measured pressure in the manifold so as to maintain a desired pressure in the manifold.

20 Claims, 4 Drawing Sheets

Fig. 2
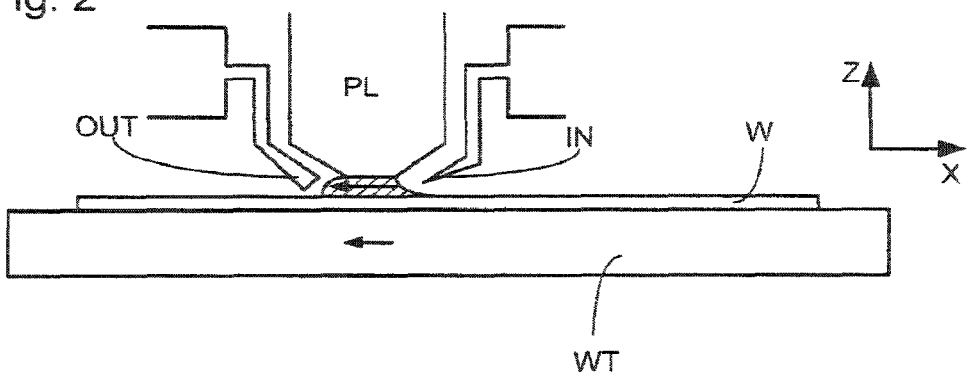
Fig. 3
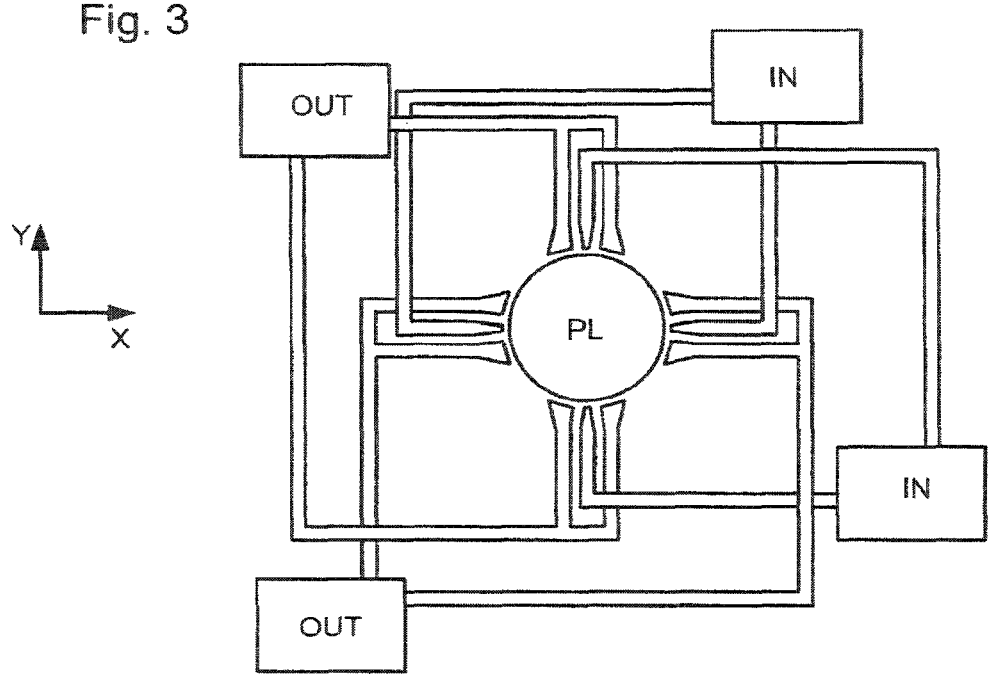
Fig. 4
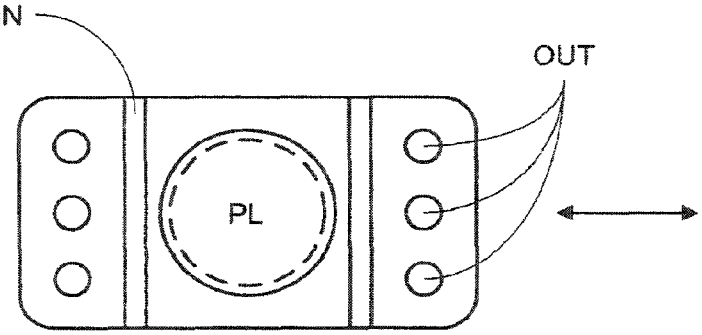
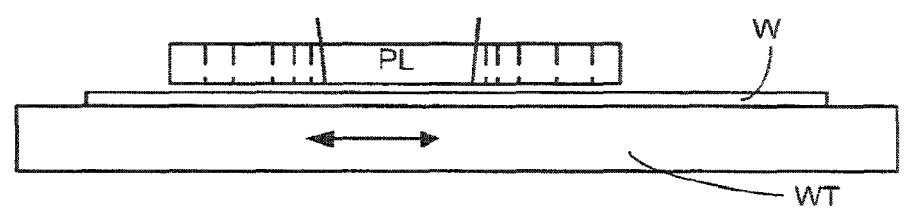

LITHOGRAPHIC APPARATUS AND DEVICE MANUFACTURING METHOD

This application is a continuation of co-pending U.S. patent application Ser. No. 11/889,844, filed Aug. 16, 2007, now allowed, the entire contents of the foregoing application is incorporated herein.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

Submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Another means to provide immersion lithography is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in-and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, N₂ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

When a gas seal is used to help contain immersion liquid, the gas is typically pumped away to form the seal, and the pumping pressure should be accurately controlled. Some of the immersion liquid is often drawn away with the gas as it is pumped, meaning that a two-phase flow is pumped. Even where no gas seal is used, some ambient gas (e.g., air) may be pumped along with the liquid, meaning that a two-phase flow may be still be pumped. Controlling the exit pressure of such a two-phase flow is problematic, primarily because the mixture is not homogeneous.

Nevertheless, the two-phase exit flow from the immersion system, for example, should be controlled so as not to introduce disturbances into the immersion liquid (for example by introducing pressure waves). Failure to control the two-phase exit flow could lead to, for example, liquid flowing into regions where it should not enter, and/or undesirable force fluctuations between the liquid supply system and substrate. In an attempt to overcome these problems, a separation tank may be used to separate the gas and the liquid, so that the pump substantially only acts on the separated gas. However, such a system has limited accuracy, especially in applications where high stability is desired and/or the pressure requirements vary with time.

It is desirable, for example, to control accurately the extraction of a liquid and gas mixture from a lithographic apparatus employing an immersion system.

According to an aspect of the invention, there is provided a lithographic projection apparatus, comprising:
- a substrate table constructed to hold a substrate;
- a projection system configured to project a patterned radiation beam onto a target portion of the substrate;
- a liquid supply system configured to at least partly fill a space between the projection system and the substrate table with a liquid, the liquid supply system comprising an outlet configured to remove a mixture of liquid and gas; and
- an evacuation system configured to draw the mixture of liquid and gas through the outlet, the evacuation system comprising:
  - a manifold configured to receive the mixture of liquid and gas from the outlet,
  - a gas inlet configured to supply the manifold with a flow of gas,
  - a separator in fluid communication with the manifold and configured to receive the mixture of liquid and gas from the manifold, and to separate gas from the mixture,
  - a pump arranged to apply suction to the separated gas in the separator, and
  - a control system configured to measure a pressure in the manifold and to control the pressure in the manifold by controlling the flow of gas into the manifold from the gas inlet in response to the measured pressure.

According to an aspect of the invention, there is provided a lithographic projection apparatus, comprising
- an immersion system comprising a liquid supply system configured, in use, to supply a liquid to a space defined by a surface of the immersion system, the liquid supply system comprising an outlet configured to remove a mixture of liquid and gas; and
- an evacuation system configured to draw the mixture of liquid and gas through the outlet, the evacuation system comprising:
  - a manifold configured to receive the mixture of liquid and gas from the outlet,
  - a gas inlet configured to supply the manifold with a flow of gas,
  - a separator in fluid communication with the manifold and configured to receive the mixture of liquid and gas from the manifold, and to separate gas from the mixture,
  - a suction device arranged to apply suction to the separated gas in the separator, and
  - a control system configured to measure a pressure in the manifold and to control the pressure in the manifold by controlling the flow of gas into the manifold from the gas inlet in response to the measured pressure.

According to another aspect of the invention, there is provided an apparatus to control removal of a mixture of liquid and gas, the apparatus comprising:
- a manifold configured to receive the mixture of liquid and gas;
- a gas inlet configured to supply the manifold with a flow of gas;
- a separator in fluid communication with the manifold and configured to receive the mixture of liquid and gas from the manifold, and to separate gas from the mixture;
- a pump arranged to apply suction to the separated gas in the separator; and
- a control system configured to measure a pressure in the manifold and to control the pressure in the manifold by controlling the flow of gas into the manifold from the gas inlet in response to the measured pressure.

According to another aspect of the invention, there is provided a device manufacturing method, comprising:
- projecting a patterned beam of radiation through a liquid onto a substrate;
- receiving a mixture of the liquid and a gas into a manifold;
- receiving the mixture of liquid and gas, from the manifold, into a separator;
- separating gas from the mixture in the separator;
- applying suction to the separated gas;
- measuring a pressure in the manifold; and
- controlling the pressure in the manifold by controlling a flow of gas into the manifold in response to the measured pressure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts a further liquid supply system for use in a lithographic projection apparatus;

DETAILED DESCRIPTION

Figure 1:
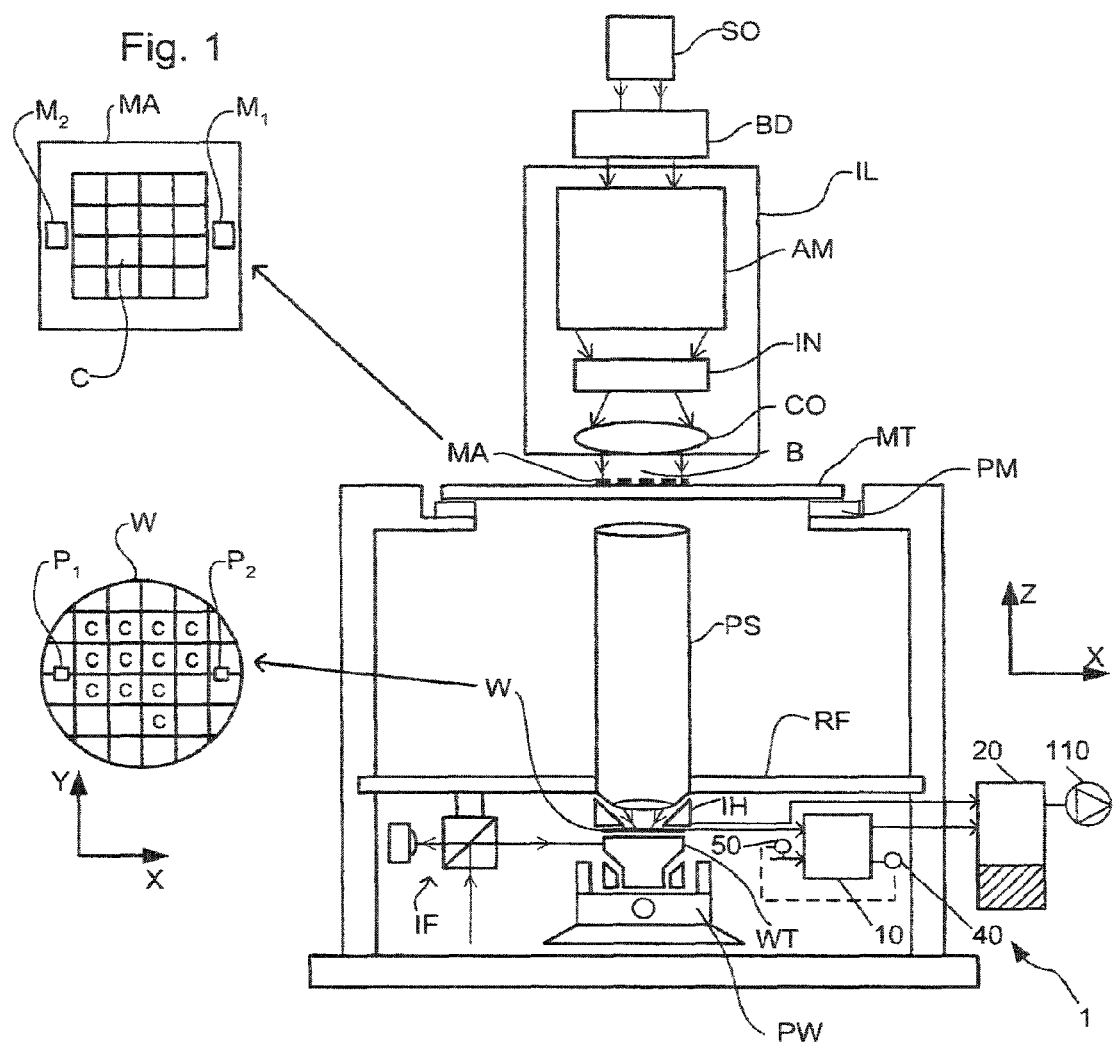
FIG. 1 depicts a lithographic apparatus according to an embodiment of the invention.

FIG. 1 schematically depicts a lithographic apparatus according to one embodiment of the invention. The apparatus comprises:
- an illumination system (illuminator) IL configured to condition a radiation beam B (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W, the projection system PS supported by a reference frame RF.
- an evacuation system 1 configured to extract a liquid and gas mixture from between the projection system PS and the substrate table WT.

The illumination system may include various types of optical components, such as refractive, reflective or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric optical systems, or any combination thereof, as appropriate for the exposure radiation being used, or for other factors such as the use of an immersion liquid. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
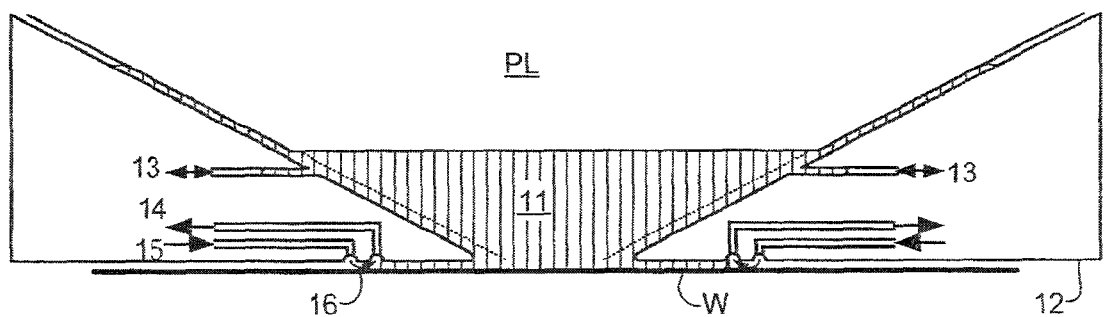
FIG. 5 depicts a further liquid supply system, comprising an immersion liquid reservoir with a liquid confinement structure and a gas seal, for use in a lithographic projection apparatus.

In a liquid supply system of an immersion lithographic apparatus, a mixture of liquid and gas may be extracted during operation of the liquid supply system. For example, one or more outlets in the liquid supply system of FIGS. 2 and 3 may extract a mixture of liquid and gas, for example, during exposure of the substrate. In another example, as shown FIG. 5, liquid and gas may be extracted to seal a gap between a liquid confinement structure and the substrate during exposure of the substrate.

A disturbance in the flow of liquid and gas in these systems and in surrounding regions may negatively affect the imaging quality of the lithographic apparatus. For example, if there is a variation in the pressure applied to an outlet of the liquid supply system, there could be a resulting disturbance in the immersion liquid itself (such as a pressure wave moving through the liquid), leading to reduction in image quality, for example by creating a force fluctuation between the liquid supply system and substrate. Thus, because the flow properties of a combination of liquid and gas make the mixture difficult to control, there may be a problem in providing stable and reliable extraction of the liquid and gas mixture.

Figure 6:
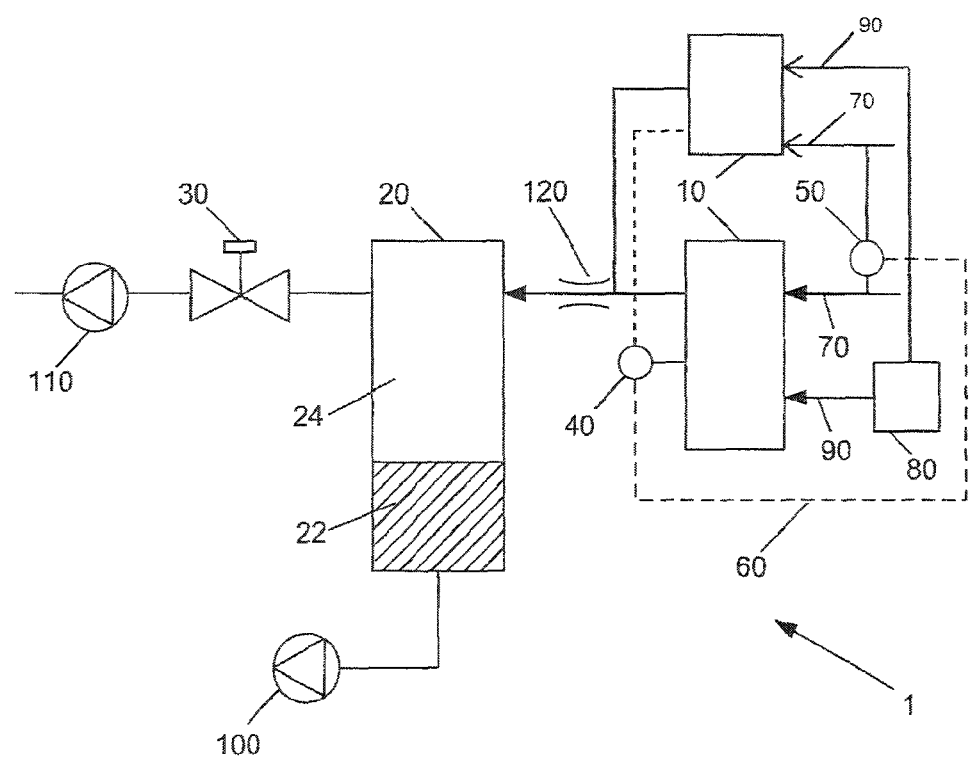
FIG. 6 depicts an evacuation system according to an embodiment of the invention.

According to an embodiment of the invention there is provided apparatus 1, as shown in FIGS. 1 and 6, configured to provide stable extraction of the liquid and gas mixture from a liquid supply system 80, IH which may be used with a lithographic apparatus. The apparatus 1 comprises a pump 110 that is connected to a separation tank 20 so as to provide below atmospheric pressure in the separation tank 20. Typically, the pressure in the separation tank 20 would be approximately −0.5 barg (0.5 bar below the exterior environmental pressure).

The separation tank 20 receives a fluid comprising a liquid and gas mixture that has been evacuated from, for example, the fluid supply system 80 of an immersion lithographic apparatus via flow restrictor 120. According to an embodiment, some or all of the liquid and gas mixture has been passed through a manifold 10 (as described in more detail below) before entering the separation tank 20. The separation tank 20 (or more generally a separator of which the separation tank is an embodiment) is arranged such that the liquid and gas mixture is separated out into a liquid phase 22 (as will be appreciated, the liquid phase may not be purely liquid; rather it is substantially liquid that may comprise gas and/or solid) and a gaseous phase 24 (as will be appreciated, the gaseous phase may not be purely gas; rather it is substantially gas that may comprise liquid and/or solid). In this way, the pump 110 substantially only pumps on the gaseous phase 24 (i.e. the pump 110 substantially only handles gas), thereby avoiding a problem (such as irregular suction) associated with a pump pumping a two-phase mixture, and providing approximate pressure control. The liquid phase 22 can be removed from the separation tank 20 via pump 100, and the gaseous phase 24 is extracted from the separation tank 20 through pressure regulator 30 using pump 110. In an embodiment, a pump 100 may not be required for the removal of the liquid phase 22 from the separation tank 20, such that a simple drain or valve would be sufficient.

According to the embodiment of the invention shown in FIG. 6, there is provided a manifold 10 to control the extraction pressure applied to the outlet 90 of the fluid supply system 80 more accurately. The manifold 10 receives a mixture of liquid and gas from an outlet 90 of the fluid supply system 80. The manifold 10 is provided with a pressure sensor 40 to measure the pressure therein. This measured pressure is input via control loop 60 into a flow controller 50 (for example, a mass flow controller 50) that controls a separate flow 70 (hereinafter referred to as "leak flow" 70) into the manifold. The mass flow controller 50 controls the leak flow 70 (for example by controlling the flow rate) in response to the pressure in the manifold as measured by sensor 40 so as to control the pressure in the manifold 10. The flow controller 50 could be any device that could be used to control the flow of leak flow 70, such as, for example, a control valve, such as an electrically driven control valve. In the embodiment shown in FIG. 6, the mass flow controller 50 operates so as to maintain a substantially constant pressure in the manifold 10. In an embodiment, the mass flow controller 50 operates so as to maintain the pressure in the manifold 10 within a desired limit. Desirably, the pressure in the manifold 10 is maintained within a 20 mbar range. More desirably, the pressure in the manifold 10 is maintained within a 10 mbar range. More desirably still, the pressure in the manifold 10 is maintained within a 1 mbar range. In an embodiment, the mass flow controller 50 may operate so as to control the pressure according to a certain target pressure sequence, for example a certain time-varying pressure sequence.

It may be that the approximate pressure variation in the fluid supply system 80 (and thus the leak flow 70 requirement) may already be known, for example from the predetermined motion of the moveable elements in the lithographic apparatus, such as the substrate table WT. In this case, the mass flow controller 50 may be pre-programmed to some extent to control the leak flow 70 according to the pre-determined requirements. For example, it may be known that in certain periods, little or no leak flow 70 is likely to be required, and so the mass flow controller 50 could be programmed accordingly so as to reduce the amount of wasted leak flow 70. Furthermore, there may also be a period during which the pressure in the manifold does not need to be controlled (for example during a prolonged period when exposure of the substrate is not taking place), and so the mass flow controller 50 could be programmed so as to reduce the amount of wasted leak flow 70 during such a period.

In an embodiment, the supply gas used for the leak flow 70 is a clean gas, such as clean dry air or nitrogen. Use of a clean gas helps to reduce the likelihood of contamination. Alternatively or additionally, any other gas could be used, such as atmospheric air.

Also according to an embodiment, the apparatus 1 is arranged such that the suction provided by the pump 110 is greater than that which is required to extract the liquid and gas mixture from outlet 90 of fluid supply system 80 at the desired rate. Thus, the mass flow controller 50 always acts so as to input gas (via leak flow 70) into the manifold 10. The feedback from pressure sensor 40 is used to determine the flow rate (or, in an alternative embodiment, flow pressure) of leak flow 70. As the mass flow controller 50 provides more leak flow 70 to the manifold 10, the pressure in the manifold 10 increases. Because the mass flow controller 50 can be flexible, accurate and have a rapid response, the pressure in the manifold 10 can be controlled very accurately. In an embodiment where the flow controller 50 comprises an electronically driven control valve, the response may be particularly flexible, accurate, and rapid.

In an embodiment, the suction provided by pump 110 is not always greater than that which is required to extract the liquid and gas mixture from outlet 90 of fluid supply system 80 at the desired rate. In such an embodiment, the mass flow controller 50 is configured to extract gas from manifold 10 (for example by using a pump), as well as supply gas via leak flow 70.

Using the apparatus 1, it is thus possible to control the pressure in the manifold 10 very accurately by refining the approximate pressure control provided by the separation tank 20 using the manifold 10, and mass flow control system 40, 50, 60 described above. In turn, this enables the exit pressure of outlet 90 from fluid supply system 80 to be controlled with high precision, thereby improving uniformity in the fluid and improving image quality.

Figure 7:
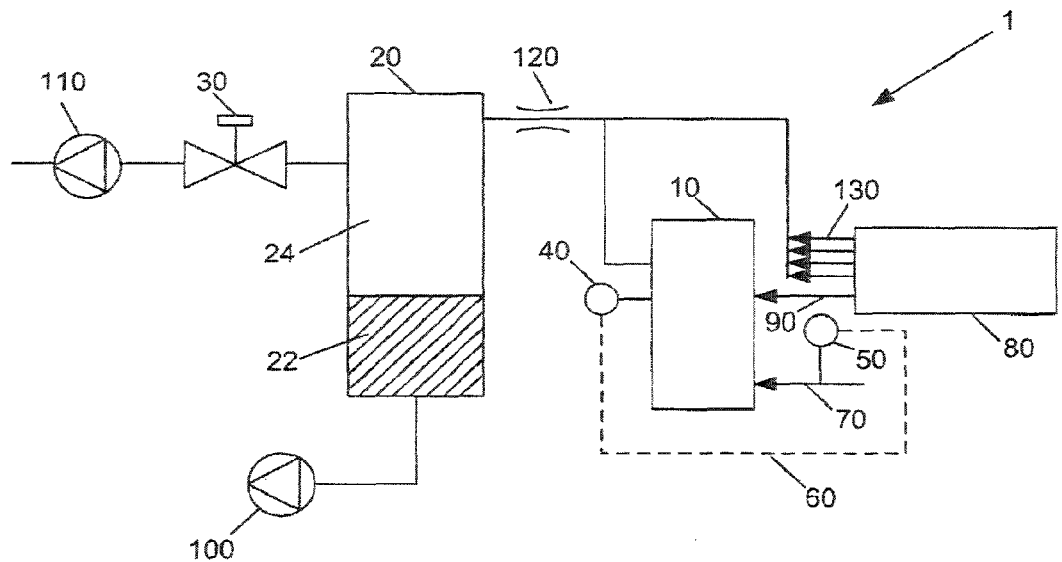
FIG. 7 depicts an evacuation system according to an embodiment of the invention.

In an embodiment, the fluid supply system 80 has more than one outlet 90, 130, as shown in FIGS. 1 and 7. One or more of the outlets 130 pass a liquid and gas mixture into the separation tank 20 without first entering a manifold 10, whereas one or more other outlets 90 pass a liquid and gas mixture into one or more manifold(s) 10 before it enters the separation tank 20. This means that only those outlet(s) 90 that require fine pressure control (such as, for example, a main line from a liquid confinement structure of the fluid supply system 80) need to be in communication with a manifold 10, whereas those outlet(s) 130 that may not require fine pressure control (such as, for example, the outlet from a wet vacuum at the edge of the substrate, or the outlet from a wet vacuum used to prevent critical areas from coming into contact with the immersion liquid) can be in direct communication with the separation tank 20 without first passing through a manifold 10.

Only having a manifold 10 connected to the outlet(s) 90 that requires accurate pressure control brings an advantage that the manifold 10 (and its associated control device, such as the mass flow controller 50 and leak flow input 70), can be smaller than if every outlet 90, 130 were connected to a single manifold. This means that less leak flow gas may be required than would be the case if every outlet 90, 130 were connected to a manifold, or if the leak flow control apparatus were applied directly to the separation tank 20, and a lower pump capacity is required at the exit of the separation tank 20.

Figure 8:
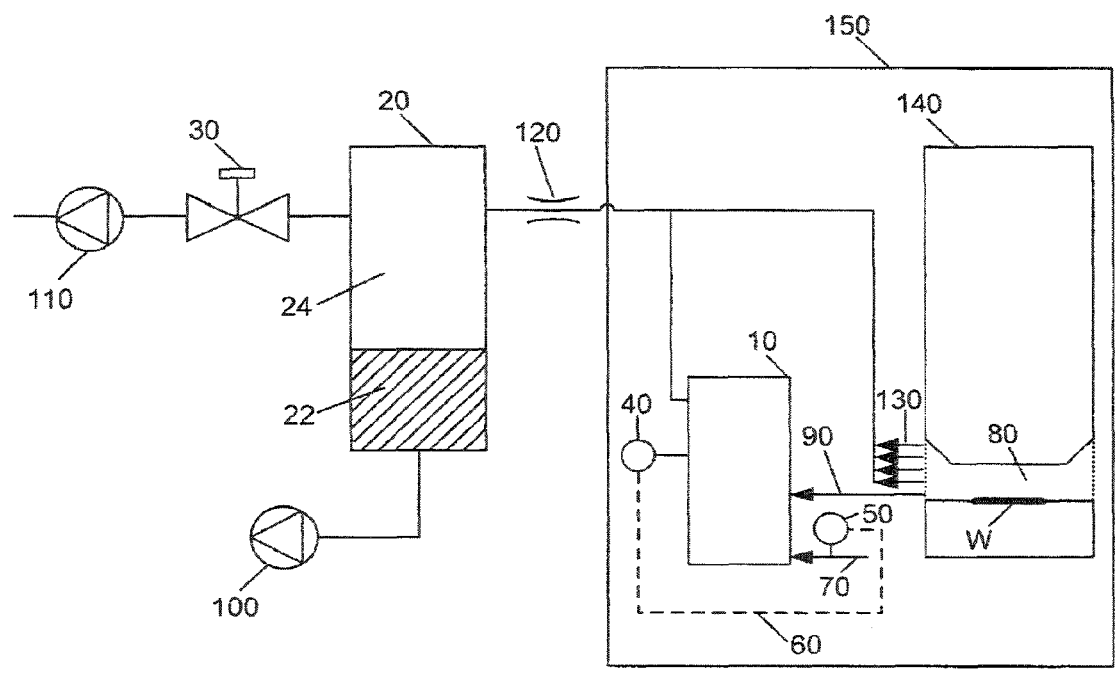
FIG. 8 depicts a lithographic apparatus with an evacuation system according to an embodiment of the invention.

An advantage of having a small, separate manifold 10 is that, as shown in FIG. 8, the manifold 10 can be placed inside the same housing 150 as the lithographic apparatus 140. Thus, the manifold 10 can be placed closer to the point where the pressure needs to be controlled (i.e. at the exit from the fluid supply system 80). This results in improved control of the pressure and more rapid response to pressure fluctuations than if all of the outlets exited into one large manifold, or if the leak flow control apparatus were applied directly to the separation tank 20.

In an embodiment, all of the liquid and gas mixture passes through a single manifold before entering the separation tank. In an embodiment, part of the liquid and gas mixture passes through a single manifold before entering the separation tank. In an embodiment, part of the liquid and gas mixture (provided, for example, by an outlet of the fluid supply system 80) passes through a first manifold before entering the separation tank, and another part of the liquid and gas mixture (provided, for example, by another outlet of the fluid supply system 80) passes through a second manifold before entering the separation tank. As such, an embodiment may be provided with as many manifolds 10 as there are outlets 90, 130 from the fluid supply system 80, or fewer manifolds 10 than there are outlets 90, 130 from the fluid supply system 80.

In an embodiment, there is provided a lithographic projection apparatus, comprising: a substrate table constructed to hold a substrate; a projection system configured to project a patterned radiation beam onto a target portion of the substrate; a liquid supply system configured to at least partly fill a space between the projection system and the substrate table with a liquid, the liquid supply system comprising an outlet configured to remove a mixture of liquid and gas; and an evacuation system configured to draw the mixture of liquid and gas through the outlet, the evacuation system comprising: a manifold configured to receive the mixture of liquid and gas from the outlet, a gas inlet configured to supply the manifold with a flow of gas, a separator in fluid communication with the manifold and configured to receive the mixture of liquid and gas from the manifold, and to separate gas from the mixture, a pump arranged to apply suction to the separated gas in the separator, and a control system configured to measure a pressure in the manifold and to control the pressure in the manifold by controlling the flow of gas into the manifold from the gas inlet in response to the measured pressure.

In an embodiment, the control system is configured to maintain a substantially constant pressure in the manifold by controlling the flow of gas into the manifold from the gas inlet in response to the measured pressure. In an embodiment, the lithographic apparatus further comprises a further outlet configured to remove a mixture of liquid and gas from the space between the projection system and the substrate table, wherein the further outlet is in direct fluid communication with the separator. In an embodiment, the lithographic apparatus further comprises a further outlet configured to remove a mixture of liquid and gas from the space between the projection system and the substrate table, and comprising: a further manifold configured to receive the mixture of liquid and gas from the further outlet and exit the mixture to the separator, the further manifold having a respective gas inlet configured to supply the further manifold with a flow of gas; and a control system configured to measure a pressure in the further manifold and maintain a substantially constant pressure in the further manifold by controlling the flow of gas into the further manifold from the respective gas inlet in response to the pressure measured in the further manifold. In an embodiment, the substrate table, the projection system, the liquid supply system, and the manifold are contained within a same housing. In an embodiment, the control system is configured to maintain the pressure in the manifold within a tolerance of 10 mbar. In an embodiment, the control system is configured to maintain the pressure in the manifold within a tolerance of 1 mbar.

In an embodiment, there is provided an apparatus to control removal of a mixture of liquid and gas, the apparatus comprising: a manifold configured to receive the mixture of liquid and gas; a gas inlet configured to supply the manifold with a flow of gas; a separator in fluid communication with the manifold and configured to receive the mixture of liquid and gas from the manifold, and to separate gas from the mixture; a pump arranged to apply suction to the separated gas in the separator; and a control system configured to measure a pressure in the manifold and to control the pressure in the manifold by controlling the flow of gas into the manifold from the gas inlet in response to the measured pressure.

In an embodiment, the control system is configured to maintain a substantially constant pressure in the manifold by controlling the flow of gas into the manifold from the gas inlet in response to the measured pressure. In an embodiment, the separator is further configured to directly receive a mixture of liquid and gas. In an embodiment, the apparatus comprises: a further manifold configured to receive a mixture of liquid and gas and exit the mixture to the separator, the further manifold having a respective gas inlet configured to supply the further manifold with a flow of gas; and a control system configured to measure a pressure in the further manifold and maintain a substantially constant pressure in the further manifold by controlling the flow of gas into the further manifold from the respective gas inlet in response to the pressure measured in the further manifold. In an embodiment, the control system is configured to maintain the pressure in the manifold within a tolerance of 10 mbar. In an embodiment, the control system is configured to maintain the pressure in the manifold within a tolerance of 1 mbar.

In an embodiment, there is provided a device manufacturing method, comprising: projecting a patterned beam of radiation through a liquid onto a substrate; receiving a mixture of the liquid and a gas into a manifold; receiving the mixture of liquid and gas, from the manifold, into a separator; separating gas from the mixture in the separator; applying suction to the separated gas; measuring a pressure in the manifold; and controlling the pressure in the manifold by controlling a flow of gas into the manifold in response to the measured pressure.

In an embodiment, the method comprises maintaining a substantially constant pressure in the manifold by controlling the flow of gas into the manifold in response to the measured pressure. In an embodiment, the method further comprises supplying a mixture of liquid and gas directly to the separator. In an embodiment, the method comprises receiving a mixture of liquid and gas into a further manifold; receiving the mixture of liquid and gas, from the further manifold, into the separator; measuring a pressure in the further manifold; and maintaining a substantially constant pressure in the further manifold by controlling a flow of gas into the further manifold in response to the pressure measured in the further manifold. In an embodiment, the method comprises maintaining the pressure in the manifold within a tolerance of 10 mbar. In an embodiment, the method comprises maintaining the pressure in the manifold within a tolerance of 1 mbar.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The liquid may be a cleaning liquid. The cleaning liquid may be used to clean one or more surfaces of the immersion system. The cleaning liquid may be supplied in-line, when a patterned beam is not provided by the projection apparatus (i.e. not during exposure of a substrate). The cleaning liquid may be supplied in the same manner as the immersion fluid. The cleaning liquid can be extracted in a two phase mixture with gas, as described above for the immersion fluid.

The immersion system may include any component of the lithographic apparatus which has a surface that may come in contact with the immersion fluid during operation of apparatus. The immersion system may include any component of the lithographic apparatus which has a surface that may contact cleaning fluid during cleaning of surfaces that contact immersion fluid. Such surfaces include the surfaces of the supply system, the final element of the projection system, the substrate table, the mirror block associated with, for example, a substrate table, the surfaces of the mirror block located in the mirror block, surfaces of cleaning systems configured to clean the immersion system, closing discs and shutters. The closing disc and shutter may be configured to help retain immersion liquid in the immersion supply system after removal of a substrate and before placement of the next substrate (commonly known as substrate swap). Thus a space may be defined in the immersion system by the liquid supply system when located between the final element of the projection system and one of a number of other features of the immersion system. These features may be the substrate table, a substrate when located on the substrate table, a shutter member or a closing disc.

A pump is one example of a suction device that may be used to apply suction to the separated gas in the separator. Other suction devices may be used. One example is a gravity actuated flow.

For example, the invention may take the form of one or more computer programs containing one or more sequences of machine-readable instructions describing a method as disclosed above, or a data storage medium (e.g. semiconductor memory, magnetic or optical disk) having such a computer program stored therein. A controller may be provided to control a component of the apparatus. The controller may operate the apparatus according to the computer program embodying the invention.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
a substrate table constructed to hold a substrate;
a projection system configured to project a patterned radiation beam onto a target portion of the substrate;
a liquid supply system configured to at least partly fill a space between the projection system and the substrate table with a liquid;
an outlet configured to remove a mixture of liquid and gas; and
an evacuation system configured to draw the mixture of liquid and gas through the outlet, the evacuation system comprising:
a pump arranged to apply suction to draw the mixture of liquid and gas through the outlet,
a manifold configured to receive the mixture of liquid and gas from the outlet and to provide the mixture toward the pump without substantial removal of liquid from the mixture at the manifold,
a gas inlet configured to supply the manifold with a flow of gas, and
a control system configured to measure a pressure in the manifold and to control the pressure in the manifold by controlling the flow of gas into the manifold from, the gas inlet in response to the measured pressure.

2. The lithographic apparatus of claim 1, wherein the control system is configured to maintain a substantially constant pressure in the manifold by controlling the flow of gas into the manifold from the gas inlet in response to the measured pressure.

3. The lithographic apparatus of claim 1, further comprising a further outlet configured to remove a mixture of liquid and gas, wherein the further outlet is in fluid communication with the pump but not via the manifold.

4. The lithographic apparatus of claim 1, further comprising a further outlet configured to remove a mixture of liquid and gas, and comprising:
a further manifold configured to receive the mixture of liquid and gas from the further outlet and exit the mixture toward the pump, the further manifold having a respective gas inlet configured to supply the further manifold with a flow of gas; and
a control system configured to measure a pressure in the further manifold and maintain a substantially constant pressure in the further manifold by controlling the flow of gas into the further manifold from the respective gas inlet in response to the pressure measured in the further manifold.

5. The lithographic apparatus of claim 1, wherein the substrate table, the projection system, the liquid supply system, and the manifold are contained within a same housing.

6. The lithographic apparatus of claim 1, wherein the control system is configured to maintain the pressure in the manifold within a tolerance of 10 mbar.

7. The lithographic apparatus of claim 1, wherein the control system is configured to maintain the pressure in the manifold within a tolerance of 1 mbar.

8. A device manufacturing method, comprising:
projecting a patterned beam of radiation through a liquid onto a substrate;
receiving a mixture of the liquid and a gas into a manifold;
providing the mixture of liquid and gas, from the manifold, toward a pump without substantial removal of liquid from the mixture at the manifold;

measuring a pressure in the manifold; and controlling the pressure in the manifold by controlling a flow of gas into the manifold in response to the measured pressure.

9. The method of claim 8, comprising maintaining a substantially constant pressure in the manifold by controlling the flow of gas into the manifold in response to the measured pressure.

10. The method of claim 8, further comprising supplying a mixture of the liquid and a gas to the pump but not via the manifold.

11. The method of claim 8, comprising:

receiving a mixture of the liquid and a gas into a further manifold;

measuring a pressure in the further manifold;

maintaining a substantially constant pressure in the further manifold by controlling a flow of gas into the further manifold in response to the pressure measured in the further manifold; and providing the mixture of liquid and gas, from the further manifold, toward the pump.

12. The method of claim 8, comprising maintaining the pressure in the manifold within a tolerance of 10 mbar.

13. The method of claim 8, comprising maintaining the pressure in the manifold within a tolerance of 1 mbar.

14. A method to control removal of a mixture of liquid and gas, the method comprising:

receiving the mixture of liquid and gas into a manifold;

measuring a pressure in the manifold;

controlling the pressure in the manifold by controlling a flow of gas into the manifold in response to the measured pressure;

receiving the mixture of liquid and gas, from the manifold, into a separator without substantial removal of liquid from the mixture at the manifold;

separating gas from the mixture in the separator; and applying suction to the separated gas.

15. The method of claim 14, comprising maintaining a substantially constant pressure in the manifold by controlling the flow of gas into the manifold in response to the measured pressure.

16. The method of claim 14, further comprising supplying a mixture of the liquid and a gas to the separator but not via the manifold.

17. The method of claim 14, comprising:

receiving a mixture of the liquid and a gas into a further manifold;

measuring a pressure in the further manifold;

maintaining a substantially constant pressure in the further manifold by controlling a flow of gas into the further manifold in response to the pressure measured in the further manifold; and providing the mixture of liquid and gas, from the further manifold, toward the separator.

18. The method of claim 14, comprising maintaining the pressure in the manifold within a tolerance of 10 mbar.

19. The method of claim 14, comprising maintaining the pressure in the manifold within a tolerance of 1 mbar.

20. The method of claim 14, comprising receiving the mixture of liquid and gas into the manifold from a space between a projection system of an immersion lithography apparatus and a substrate table of the immersion lithography apparatus.

\* \* \* \* \*